US010867875B2

(12) United States Patent
Yen

(10) Patent No.: US 10,867,875 B2
(45) Date of Patent: Dec. 15, 2020

(54) PIXEL STRUCTURE AND REPAIRING METHOD THEREOF

(71) Applicant: Au Optronics Corporation, Hsinchu (TW)

(72) Inventor: Ze-Yu Yen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 15 days.

(21) Appl. No.: 16/520,356

(22) Filed: Jul. 24, 2019

(65) Prior Publication Data
US 2020/0219779 A1  Jul. 9, 2020

(30) Foreign Application Priority Data

Jan. 7, 2019  (TW) .............................. 108100533 A

(51) Int. Cl.
| | | |
|---|---|---|
| *H01L 21/66* | (2006.01) | |
| *H01L 25/075* | (2006.01) | |
| *H01L 33/62* | (2010.01) | |

(52) U.S. Cl.
CPC .......... *H01L 22/22* (2013.01); *H01L 25/0753* (2013.01); *H01L 25/0756* (2013.01); *H01L 33/62* (2013.01); *H01L 2933/0066* (2013.01)

(58) Field of Classification Search
CPC . H01L 22/22; H01L 25/0753; H01L 25/0756; H01L 33/62; H01L 2933/0066

USPC .............................................................. 438/4
See application file for complete search history.

(56) References Cited

U.S. PATENT DOCUMENTS

| | | | |
|---|---|---|---|
| 8,791,474 | B1 | 7/2014 | Bibl et al. |
| 10,043,788 | B1 | 8/2018 | Han |
| 2016/0351092 | A1 | 12/2016 | Chen et al. |
| 2018/0226388 | A1 | 8/2018 | Han |
| 2019/0172761 | A1 | 6/2019 | Guo et al. |

FOREIGN PATENT DOCUMENTS

| | | |
|---|---|---|
| CN | 105023522 | 11/2015 |
| CN | 106684098 | 5/2017 |
| TW | I641126 | 11/2018 |

*Primary Examiner* — Elias Ullah
(74) *Attorney, Agent, or Firm* — JCIPRNET

(57) ABSTRACT

A pixel structure includes a substrate, an active device layer, a first insulating layer disposed on the active device layer, a first light emitting element and a second light emitting element disposed on the first insulating layer, a plurality of first signal lines disposed on the first insulating layer, and a plurality of second signal lines. The first signal lines are electrically connected to the active device layer, and the first signal lines are electrically insulated from the first light emitting element. The second signal lines are electrically connected to the first signal lines and the second light emitting element. The second light emitting element overlaps with a portion of the first light emitting element in a first direction. Electrodes of the first light emitting element and electrodes of the second light emitting element are disposed facing the first direction. A repairing method of the pixel structure is also provided.

10 Claims, 11 Drawing Sheets

PIXEL STRUCTURE AND REPAIRING METHOD THEREOF

CROSS-REFERENCE TO RELATED APPLICATION

This application claims the priority benefit of Taiwan application serial no. 108100533, filed on Jan. 7, 2019. The entirety of the above-mentioned patent application is hereby incorporated by reference herein and made a part of this specification.

BACKGROUND

Technical Field

The disclosure relates to a pixel structure and a repairing method thereof, and more particularly, to a pixel structure of vertically stacked light emitting elements and a repairing method thereof.

Description of Related Art

With the advancement of technology, light-emitting diodes have become common components that are widely used in various fields. As a light source, the light-emitting diode has many advantages, including low energy consumption, long lifetime, and high switching speed. Therefore, conventional light sources have gradually been replaced by light-emitting diodes.

In addition to serving as a light source, light-emitting diodes have also been used in the display field. In general, light-emitting diodes are mass-transferred into sub-pixels. When a light-emitting diode is damaged or is deviated from the predetermined position due to precision tolerance and cannot be connected to the wire, the light-emitting diode cannot emit light and thus causes dark spots, which degrades the display quality. In addition, the conventional repairing method involves replacing the light-emitting diodes one by one, which not only requires a complicated process, but also requires a lot of time and increases the manufacturing cost.

SUMMARY

A pixel structure according to an embodiment of the invention includes a substrate, an active device layer disposed on the substrate, a first insulating layer disposed on the active device layer, a first light emitting element disposed on the first insulating layer, a second light emitting element disposed on the first insulating layer, a plurality of first signal lines disposed on the first insulating layer, and a plurality of second signal lines. The first light emitting element includes a first semiconductor layer, a second semiconductor layer, a first electrode electrically connected to the first semiconductor layer, and a second electrode electrically connected to the second semiconductor layer. The second light emitting element includes a third semiconductor layer, a fourth semiconductor layer, a third electrode electrically connected to the third semiconductor layer, and a fourth electrode electrically connected to the fourth semiconductor layer. The first signal lines are electrically connected to the active device layer, and the first signal lines are electrically insulated from the first electrode of the first light emitting element. The second signal lines are electrically connected to the first signal lines and the third electrode of the second light emitting element. The second light emitting element overlaps with a portion of the first light emitting element in a first direction, and the first electrode, the second electrode, the third electrode, and the fourth electrode are disposed facing the first direction.

A repairing method of a pixel structure according to an embodiment of the invention includes the following steps. A substrate is provided. An active device layer is formed on the substrate. A first insulating layer is formed on the active device layer. A first light emitting element is transferred onto the first insulating layer. A circuit layer is formed on the first insulating layer, and the circuit layer is electrically connected to the active device layer. A second insulating layer is formed on the first insulating layer, and the second insulating layer covers the first light emitting element and the circuit layer. A second light emitting element is disposed on the second insulating layer, and the second light emitting element overlaps with a portion of the first light emitting element in a first direction. A plurality of second signal lines are formed on the second insulating layer, and the second signal lines are electrically connected to the circuit layer and the second light emitting element. The first light emitting element has a first electrode and a second electrode, the second light emitting element has a third electrode and a fourth electrode, and the first electrode, the second electrode, the third electrode, and the fourth electrode are disposed facing the first direction.

Based on the above, in the pixel structure and/or the repairing method thereof of an embodiment of the invention, when performing repairs, it is possible to perform repairing without removing the first light emitting element which causes dark spots due to precision tolerance or damage. Accordingly, it is possible to simplify the repairing method of the pixel structure and shorten the repairing time to reduce the manufacturing cost of the pixel structure. Furthermore, after the pixel structure is repaired, the second light emitting element may overlap with a portion of the first light emitting element and is disposed as a vertical stack. Therefore, the pixel structure can have a desirable light field pattern to improve the display quality using the above pixel structure.

One of the objectives of the invention is to repair a pixel structure which causes dark spots due to precision tolerance.

One of the objectives of the invention is to repair a pixel structure which causes dark spots due to damage.

One of the objectives of the invention is to simplify a repairing method of a pixel structure.

One of the objectives of the invention is to shorten the repairing time of a pixel structure.

One of the objectives of the invention is to reduce the manufacturing cost of a pixel structure.

One of the objectives of the invention is to improve the display quality using the pixel structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
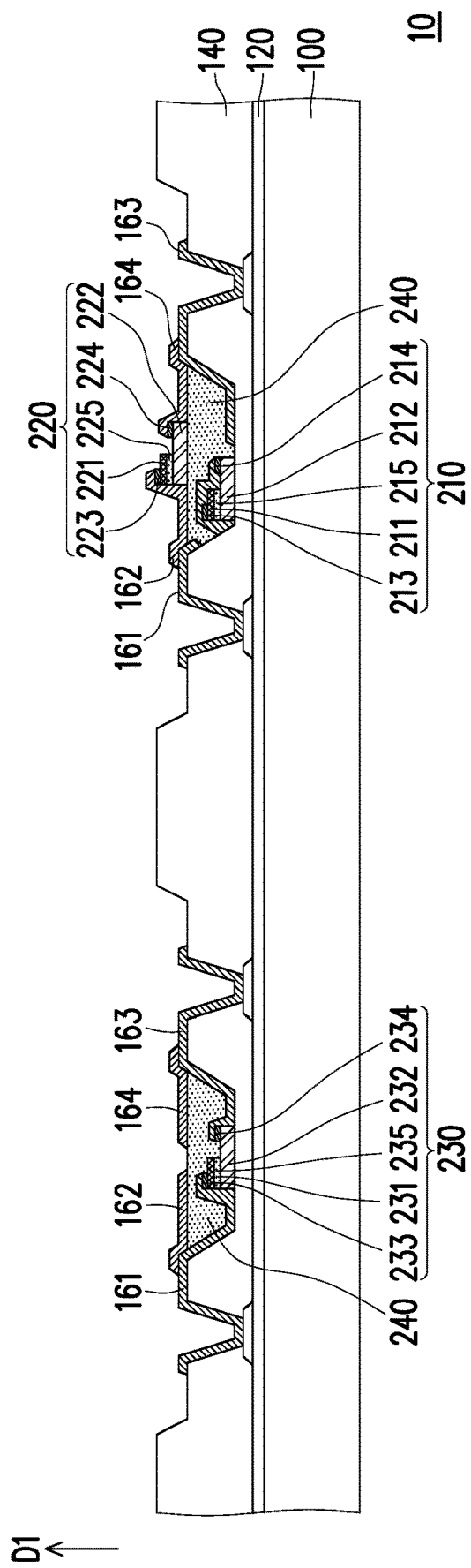
FIG. 1 is a schematic cross-sectional view of a pixel structure according to an embodiment of the invention.

To provide a further understanding of the above features and advantages of the invention, exemplary embodiments will be provided and detailed below with reference to the accompanying drawings. As people skilled in the art will learn, the embodiments described herein may be modified in various manners without departing from the spirit or scope of the invention.

In the accompanying drawings, thicknesses of devices are exaggerated for clarity. Throughout the specification, the same reference numerals in the accompanying drawings denote the same devices. It should be understood that when a device such as a layer, film, region, or substrate is referred to as being "on", "connected to", or "overlapping with" another device, it may be directly on or connected to another device, or intervening devices may also be present. In contrast, when a device is referred to as being "directly on" or "directly connected to" another device, no intervening devices are present. As used herein, the term "connected" may refer to physical connection and/or electrical connection.

It should be noted that although the terms "first", "second", "third", etc. may be used for describing various elements, components, regions, layers, and/or portions, the elements, components, regions, layers, and/or portions are not limited by these terms. These terms are only used for separating one element, component, region, layer, or portion from another element, component, region, layer, or portion. Therefore, the "first element", "component", "region", "layer", or "portion" discussed below may also be referred to as the second element, component, region, layer, or portion without departing from the scope of the invention.

The terminology used herein is only for the purpose of describing specific embodiments and is not intended to be restrictive. As used herein, the singular forms "a", "an", and "the" are intended to cover the plural forms including "at least one" as well, unless the context clearly indicates otherwise. "or" represents "and/or". The term "and/or" used herein includes any one or all combinations of one or more of the relevant listed items. It will be further understood that the terms "comprise" and/or "include", when used herein, specifies the presence of the specified features, regions, entirety, steps, operations, elements, and/or components, but do not exclude the presence or addition of one or more other features, regions, entireties, steps, operations, elements, components, and/or combinations thereof.

Moreover, relative terms such as "below" or "bottom" and "above" or "top" may serve to describe the relation between one component and another component herein as shown in the drawings. It should also be understood that the relative terms are intended to include different orientations of a device in addition to the orientation shown in the drawings. For example, if a device in the drawings is turned upside down, a component described as being "below" another component shall be re-orientated to be "above" the another component. Thus, the exemplary term "below" may include the orientations of "below" and "above", depending on the specific orientation of the drawings. Similarly, if a device in the drawings is turned upside down, a component described to be "under" or "below" another component shall be re-oriented to be "above" the another component. Therefore, the exemplary term "under" or "below" may include orientations of "above" and "below".

The term "about", "substantially", "basically", or "similar" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value.

Unless otherwise defined, all terms (including technical and scientific terms) used herein have the same meaning as commonly understood by people of ordinary skill in the art. It will be further understood that terms, such as those defined in the commonly used dictionaries, should be interpreted as having a meaning that is consistent with their meaning in the context of the relevant art and the invention and will not be interpreted in an idealized or overly formal sense unless expressly so defined herein.

Exemplary embodiments will be described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shapes of the regions, and are not intended to limit the scope of the claims.

FIG. 1 is a schematic cross-sectional view of a pixel structure according to an embodiment of the invention. Referring to FIG. 1, in the present embodiment, a pixel structure 10 includes a substrate 100, an active device layer 120 disposed on the substrate 100, a first insulating layer 140 disposed on the active device layer 120, a first light emitting element 210 disposed on the first insulating layer 140, a second light emitting element 220 disposed on the first insulating layer 140, a plurality of first signal lines 161 disposed on the first insulating layer 140, and a plurality of second signal lines 162 electrically connected to the first signal lines 161 and the second light emitting element 220. In a first direction D1, the second light emitting element 220 overlaps with a portion of the first light emitting element 210. The pixel structure 10 further includes a third light emitting element 230 disposed on the first insulating layer 140. The first signal lines 161 are electrically connected to the third light emitting element 230. In the present embodiment, the pixel structure 10 is, for example, a light emitting diode (LED) which is applied to a display panel to be repaired. A repairing method of the pixel structure 10 will be described below by way of an embodiment.

Figure 2A:
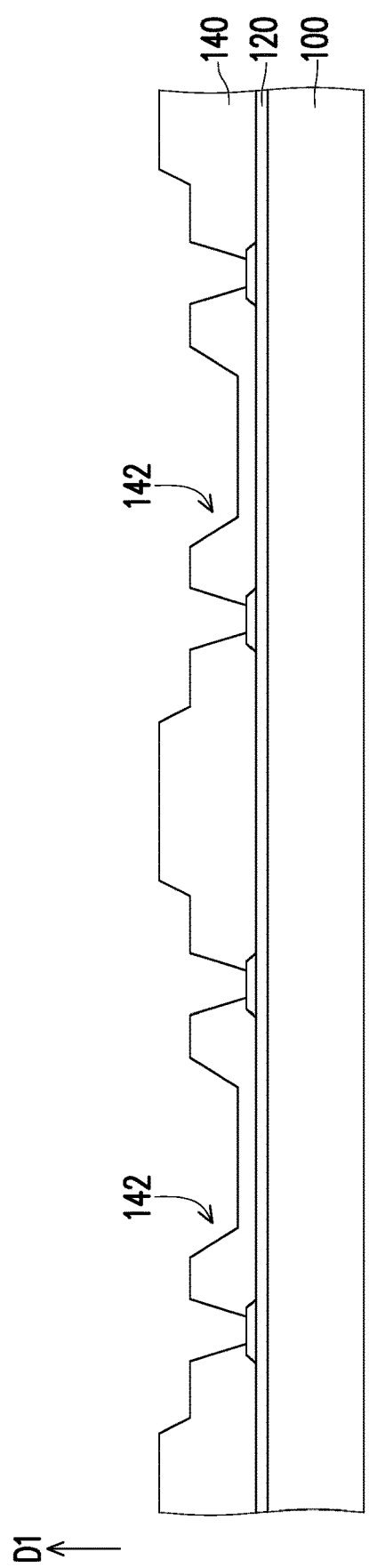
FIG. 2A to FIG. 2H are schematic cross-sectional views of a repairing method of a pixel structure according to an embodiment of the invention.

FIG. 2A to FIG. 2H are schematic cross-sectional views of a repairing method of a pixel structure according to an embodiment of the invention. FIG. 3A is a schematic top view of a first light emitting element and a second light emitting element according to an embodiment of the invention. For convenience of illustration and observation, FIG.

Figure 3A:
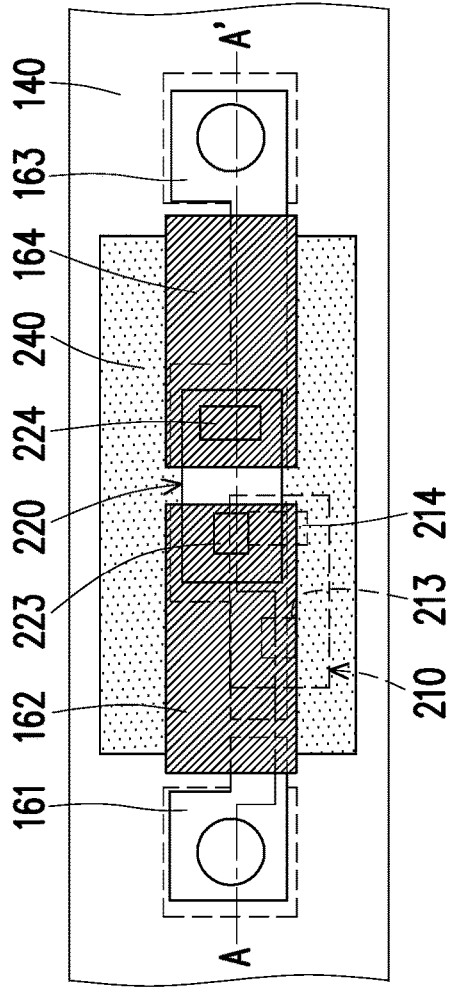
FIG. 3A is a schematic top view of a first light emitting element and a second light emitting element according to an embodiment of the invention.
Figure 3B:
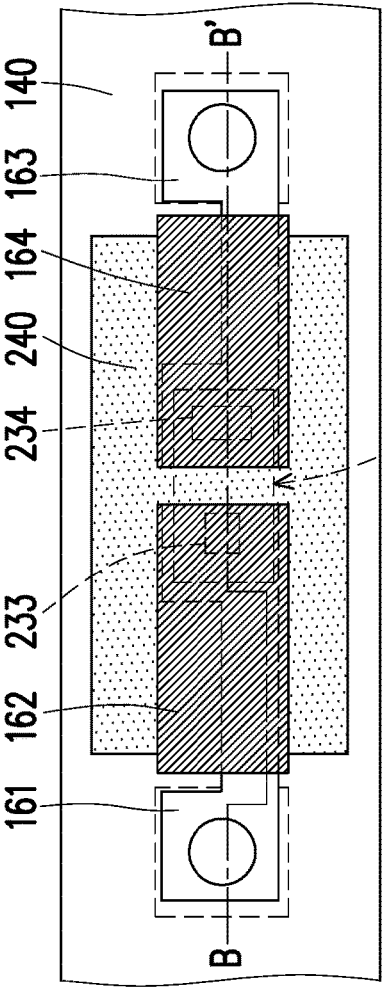
FIG. 3B is a schematic top view of a third light emitting element according to an embodiment of the invention.

3A only schematically shows a part of the components. FIG. 3B is a schematic top view of a third light emitting element according to an embodiment of the invention. For convenience of illustration and observation, FIG. 3B only schematically shows a part of the components. Referring to FIG. 2A, first, the substrate 100 is provided. Next, the active device layer 120 is formed on the substrate 100. The material of the substrate 100 may be glass, quartz, an organic polymer, a non-transparent/reflective material (e.g., a conductive material, a metal, a wafer, a ceramic, or another applicable material), or another applicable material. If conductive materials or metals are used, the substrate 100 is covered with a layer of insulating material (not shown) to avoid a short circuit issue.

The active device layer 120 is, for example, an active device array including a dielectric layer, a plurality of active devices, and a plurality of wires connecting the active devices (not shown). The active device includes a thin film transistor (TFT). The thin film transistor includes a gate, a channel layer, and a source and a drain electrically connected to the channel layer (not shown). The thin film transistor may be a bottom gate-TFT, a top gate-TFT, or a thin film transistor of another suitable type. In the present embodiment, the thin film transistor is, for example, a low temperature poly-Si (LIPS) TFT or an amorphous Si (a-Si) TFT, but the invention is not limited thereto.

Next, the first insulating layer 140 is formed on the active device layer 120. The step of forming the first insulating layer 140 includes: first forming a first insulating material (not shown), and then forming a plurality of accommodating spaces 142 in the first insulating material to complete the first insulating layer 140. In some embodiments, the step further includes forming a plurality of openings (not labeled) penetrating through the first insulating layer 140 in the first insulating material, so that signal lines, such as scan lines, data lines, or power lines, can be electrically connected to the active device layer 120 through the openings in a subsequent process. In the present embodiment, the material of the first insulating layer 140 includes a photoresist material having adhesiveness. The photoresist material includes a photo-curable photoresist material or a thermo-setting photoresist material. The method of forming the first insulating material includes physical vapor deposition or chemical vapor deposition. The method of forming the accommodating spaces 142 includes: performing a photolithography process through a half-tone mask or a grey-tone mask to pattern the first insulating material. Therefore, the invention can directly pattern the photoresist material as the insulating layer to simplify the process.

In some embodiments, the material of the first insulating layer 140 also includes an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide-based resin, an epoxy-based resin, or an acrylic resin, but the invention is not limited thereto.

Figure 2B:
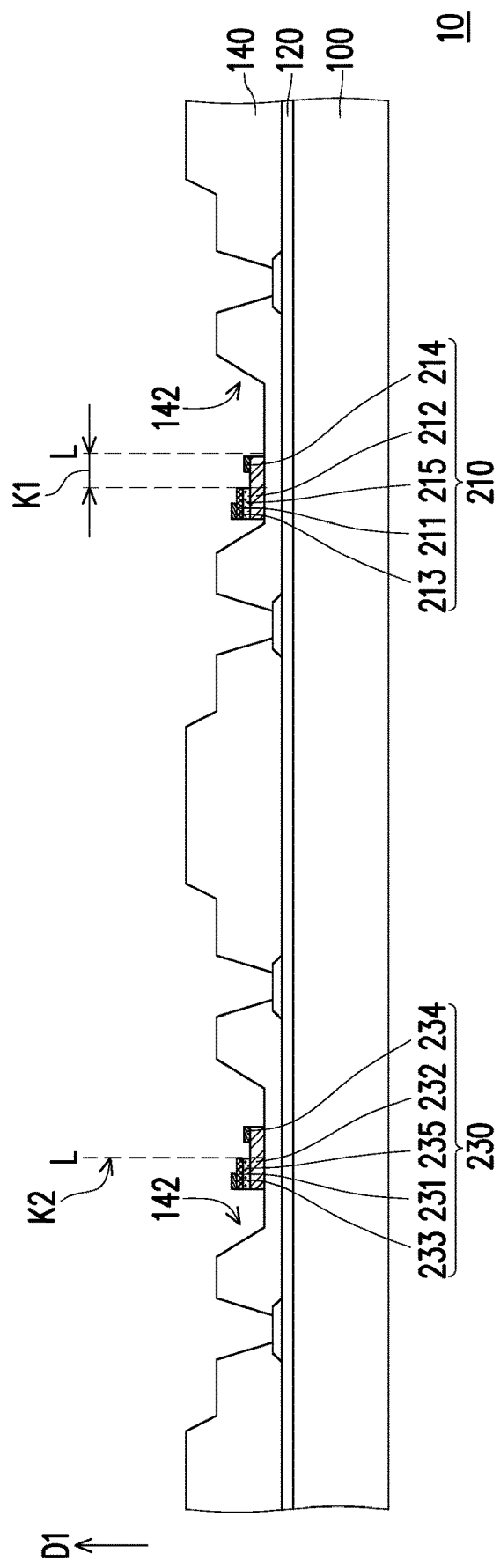

Referring to FIG. 2B, next, the first light emitting element 210 is transferred onto the first insulating layer 140. Furthermore, before performing the subsequent step of forming the first signal lines 161, the repairing method of the pixel structure 10 further includes transferring the third light emitting element 230 onto the first insulating layer 140. For example, the first light emitting element 210 and the third light emitting element 230 are respectively disposed in the corresponding accommodating spaces 142 of the first insulating layer 140. In the present embodiment, the first light emitting element 210 is disposed in the accommodating space 142 on the right side in FIG. 2B, and the third light emitting element 230 is disposed in the accommodating space 142 on the left side in FIG. 2B.

The method of transferring the light emitting elements 210 and 230 includes: first, disposing the grown light emitting elements 210 and 230 on a temporary carrier board (not shown), and then transferring the light emitting elements 210 and 230 onto the first insulating layer 140 through an electrostatic method, a vacuum suction method, a pick-and-place method, a wafer-to-wafer bonding method, or an adhesion method.

In the present embodiment, the first light emitting element 210 may be a horizontal light emitting diode. In other words, the electrodes of the first light emitting element 210 and the third light emitting element 230 are all located on the same side (which will be described later). In the present embodiment, the light emitting elements 210 and 230 are, for example, micro LEDs, mini LEDs, or quantum dot LEDs. As shown in FIG. 2B, the first light emitting element 210 includes a first semiconductor layer 211, a second semiconductor layer 212, a first electrode 213 electrically connected to the first semiconductor layer 211, and a second electrode 214 electrically connected to the second semiconductor layer 212. The first semiconductor layer 211 is formed on the second semiconductor layer 212. In some embodiments, the first light emitting element 210 further includes a first light emitting layer 215, and the first light emitting layer 215 is located between the first semiconductor layer 211 and the second semiconductor layer 212. The third light emitting element 230 includes a fifth semiconductor layer 231, a sixth semiconductor layer 232, a fifth electrode 233 electrically connected to the fifth semiconductor layer 231, and a sixth electrode 234 electrically connected to the sixth semiconductor layer 232. The fifth semiconductor layer 231 is formed on the sixth semiconductor layer 232. In some embodiments, the third light emitting element 230 further includes a third light emitting layer 235, and the third light emitting layer 235 is located between the fifth semiconductor layer 231 and the sixth semiconductor layer 232.

Specifically, the method of manufacturing the first light emitting element 210 is as follows. First, the second semiconductor layer 212, the first light emitting layer 215, and the first semiconductor layer 211 are sequentially formed on an epitaxial substrate (not shown). In some embodiments, the conductivity type of the first semiconductor layer 211 is different from the conductivity type of the second semiconductor layer 212. For example, the second semiconductor layer 212 may be an N-type semiconductor material, and the first semiconductor layer 211 may be a P-type semiconductor material, or vice versa. In some embodiments, the N-type semiconductor material or the P-type semiconductor material includes gallium nitride (GaN), indium gallium nitride (InGaN), gallium arsenide (GaAs), other materials formed of group IIIA and group VA elements, or other suitable materials, but the invention is not limited thereto. The first light emitting layer 215 has, for example, a quantum well (QW) such as a single quantum well (SQW), multiple quantum wells (MQW), or another quantum well. The holes provided by the P-type semiconductor layer and the electrons provided by the N-type semiconductor layer may be combined in the light emitting layer and emit energy in the form of light. The material of the first light emitting layer 215 includes, for example, gallium nitride (GaN), indium gallium nitride (InGaN), gallium arsenide (GaAs), aluminum gallium indium phosphide (AlGaInP), indium aluminum gallium arsenide (InAlGaAs), other materials formed of group IIIA and group VA elements, or other suitable materials.

Then, a portion of the first semiconductor layer 211 and a portion of the first light emitting layer 215 are removed to expose a portion of the surface of the second semiconductor layer 212. Next, the first electrode 213 is formed on a portion of the surface of the first semiconductor layer 211, and the second electrode 214 is formed on the surface of the second semiconductor layer 212. In some embodiments, the first electrode 213 and the second electrode 214 may be formed of the same material, such as a conductive material. In the present embodiment, the first electrode 213 and the second electrode 214 are formed on the same side of the first light emitting element 210 and face the same direction. Therefore, the first light emitting element 210 is a horizontal light emitting diode.

The manufacturing method and the material of the third light emitting element 230 are similar to those of the first light emitting element 210 and shall not be repeatedly described herein. In the present embodiment, the fifth electrode 233 and the sixth electrode 234 are formed on the same side of the third light emitting element 230 and face the same direction. At this time, the growth of the first light emitting element 210 and the third light emitting element 230 has been completed.

In the present embodiment, in the first direction D1 perpendicular to the substrate 100, the second semiconductor layer 212 of the first light emitting element 210 contacts the first insulating layer 140, and the sixth semiconductor layer 232 of the third light emitting element 230 contacts the first insulating layer 140. Accordingly, the first electrode 213, the second electrode 214, the fifth electrode 233, and the sixth electrode 234 are all disposed facing the same first direction D1. In the present embodiment, the first direction D1 is a direction extending vertically toward above the substrate 100.

It is noted here that, due to the precision tolerance of the transfer process or due to the unevenness of the surface of the first insulating layer 140, the first light emitting element 210 may be displaced after the transfer, which thus causes deviation of the first light emitting element 210. Specifically, the accommodating space 142 has a center line L, and the position of the center line L is, for example, the predetermined transfer position of the light emitting elements 210 and 230. For example, the center of the first light emitting element 210 does not overlap with the center line L of the corresponding accommodating space 142 and is at a distance K1 from the center line L. This is because the first light emitting element 210 deviates from the predetermined transfer position at the time of transfer. On the other hand, the center of the third light emitting element 230 may overlap with the center line L of the corresponding accommodating space 142. Therefore, a distance K2 between the center of the third light emitting element 230 and the center line L may be extremely small or non-present (as shown in FIG. 2B, since the center of the third light emitting element 230 fully overlaps with the center line L, the distance K2 is zero and is directly labeled on the center line L). In other words, the distance K1 is greater than the distance K2. Since the first light emitting element 210 is deviated, the first light emitting element 210 cannot be securely electrically connected to the wires in the subsequent process and is thus defined as the light emitting element to be repaired. Since the third light emitting element 230 is not deviated, the third light emitting element 230 can be smoothly electrically connected to the wires in the subsequent process and is thus defined as the light emitting element that does not need repairing.

Figure 2C:
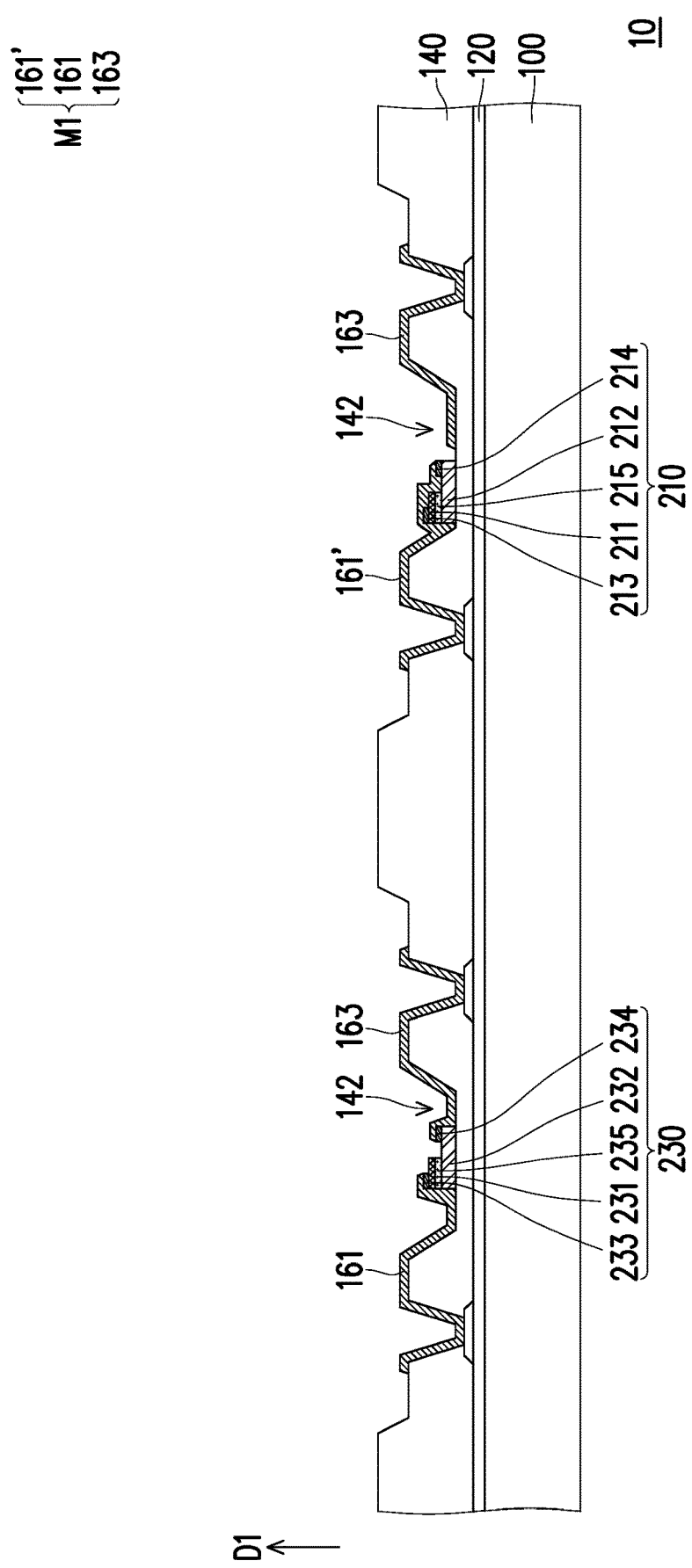

Referring to FIG. 2C, next, a circuit layer M1 is formed on the first insulating layer 141. Out of conductivity considerations, the circuit layer M1 is generally formed of a metal material, but the invention is not limited thereto. In other embodiments, the circuit layer M1 may also be formed of other conductive materials, such as alloys, nitrides of metal materials, oxides of metal materials, oxynitrides of metal materials, or a stacked layer of metal materials and other conductive materials. The method of forming the circuit layer M1 includes physical vapor deposition or chemical vapor deposition.

The circuit layer M1 includes a plurality of first signal lines 161 and a plurality of third signal lines 163. Specifically, before the subsequent removal process is performed, the circuit layer M1 further includes a plurality of pre-cutoff first signal lines 161'. For example, the first signal lines 161 and the pre-cutoff first signal line 161' of the circuit layer M1 may be electrically connected to the active devices of the active device layer 120, the third signal lines 163 may be electrically connected to the power lines of the active device layer 120, and vice versa.

The method of forming the first signal lines 161, the pre-cutoff first signal lines 161', and the third signal lines 163 includes the photolithography process. Specifically, the first signal lines 161, the pre-cutoff first signal lines 161', and the third signal lines 163 may be the same film layer and completed in the same process step, but the invention is not limited thereto.

As shown in FIG. 2C, the first signal line 161 can be electrically connected to the fifth electrode 233 of the third light emitting element 230, and the third signal line 163 can be electrically connected to the sixth electrode 234 of the third light emitting element 230 to complete electrical connection of the third light emitting element 230 to the active device layer 120. However, since the first light emitting element 210 is deviated, the pre-cutoff first signal line 161' can electrically connect the active device layer 120 to the first electrode 213 of the first light emitting element 210, but the third signal line 163 does not contact the second electrode 214 of the first light emitting element 210. In other words, the third signal line 163 is electrically insulated from the second electrode 214.

In some embodiments, a detection process may be performed after the step of forming the circuit layer M1. The detection process is adapted to detect whether a light emitting element having electrical abnormality is present in the pixel structure 10. For example, since the third light emitting element 230 can be electrically connected to the active device layer 120 through the first signal line 161 and the third signal line 163, electrical abnormality does not occur, and the third light emitting element 230 may be determined as the light emitting element that does not need repairing. However, since the first light emitting element 210 is only electrically connected to the pre-cutoff first signal line 161' and is electrically insulated from the third signal line 163, electrical abnormality occurs, and the first light emitting element 210 is determined as the light emitting element to be repaired.

Figure 2D:
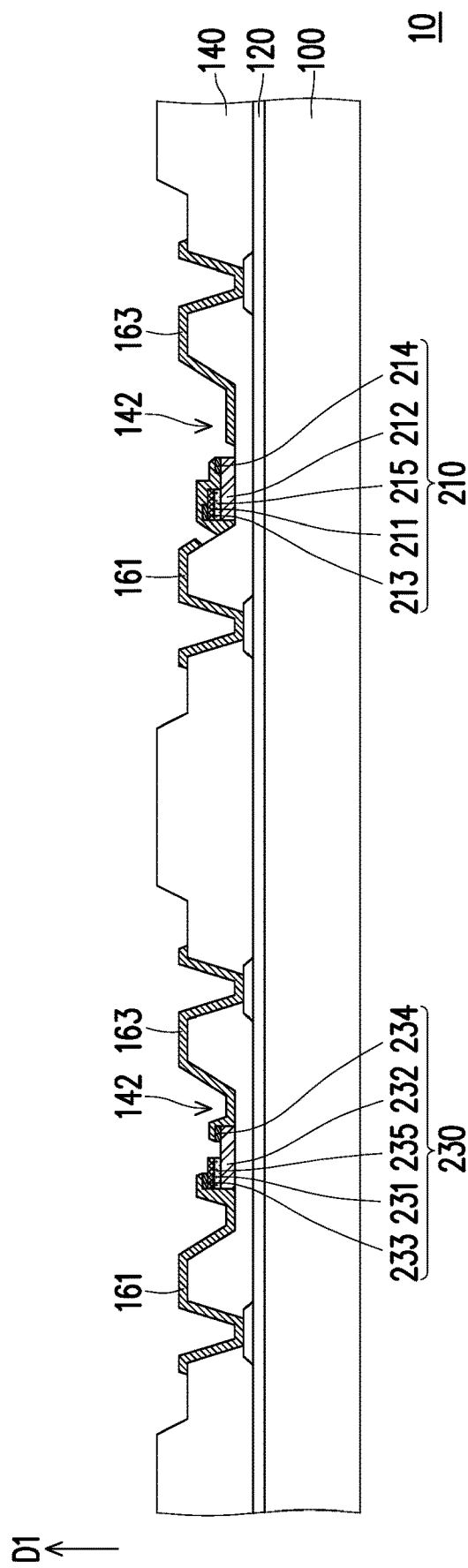

It is noted that, referring to FIG. 2C and FIG. 2D, when the pixel structure 10 has a light emitting element determined to be repaired, e.g., the first light emitting element 210, the repairing method of the pixel structure 10 may further include a step of performing a removal process (not shown) after the step of forming the circuit layer M1. The removal process may cut off the connection between the circuit layer M1 and the first light emitting element 210. For example, when the detection process determines that the first light emitting element 210 has electrical abnormality, the removal process may be subsequently performed to cut off the pre-cutoff first signal line 161' connected between the active device layer 120 and the first light emitting element 210, and the disconnected pre-cutoff first signal line 161' may be left on the first insulating layer 140 as the first signal line 161. On the other hand, the removal process is not performed on the third light emitting element 230, which is determined as electrically normal. In other words, after the step of performing the removal process, the first signal line 161 (including the disconnected pre-cutoff first signal line 161') of the circuit layer M1 is electrically insulated from the first light emitting element 210. With the above configuration, the electrical connection between the first light emitting element 210 and the active device layer 120 can be cut off and thus does not affect the electrical properties and functions of the active device layer 120. The removal process includes laser cutting or mechanical cutting, but the invention is not limited thereto. Other removal methods commonly used in the art may also be used herein.

In some embodiments, if the first light emitting element to be repaired is only electrically connected to the third signal line, the removal process may also cut off the third signal line connecting the active device layer and the first light emitting element, and the invention is not limited thereto.

Figure 2E:
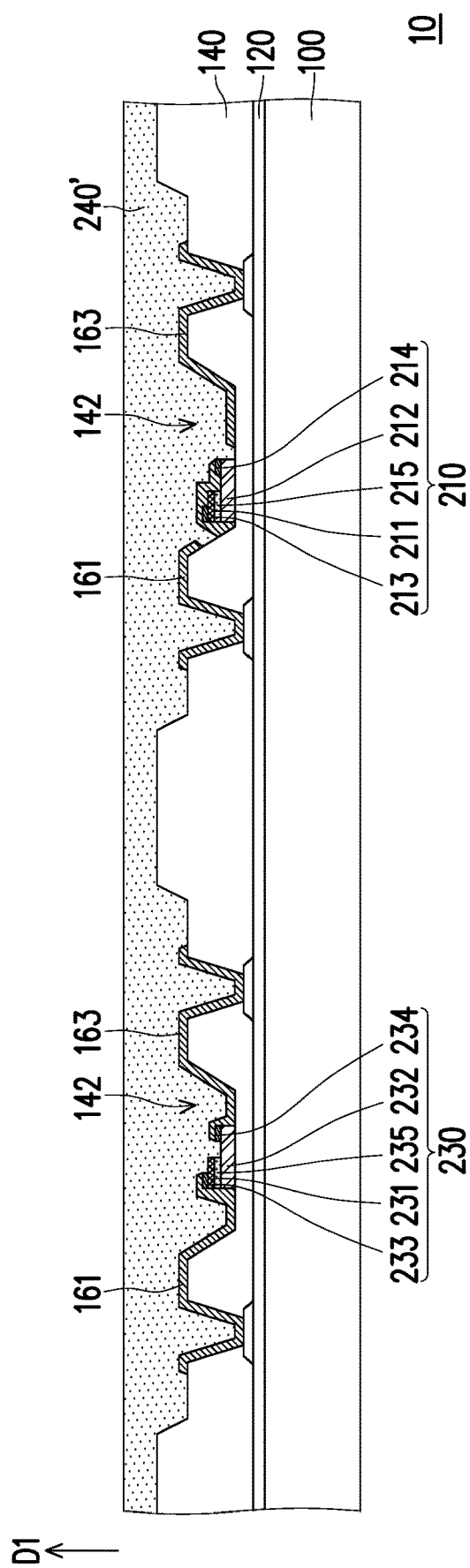
Figure 2F:
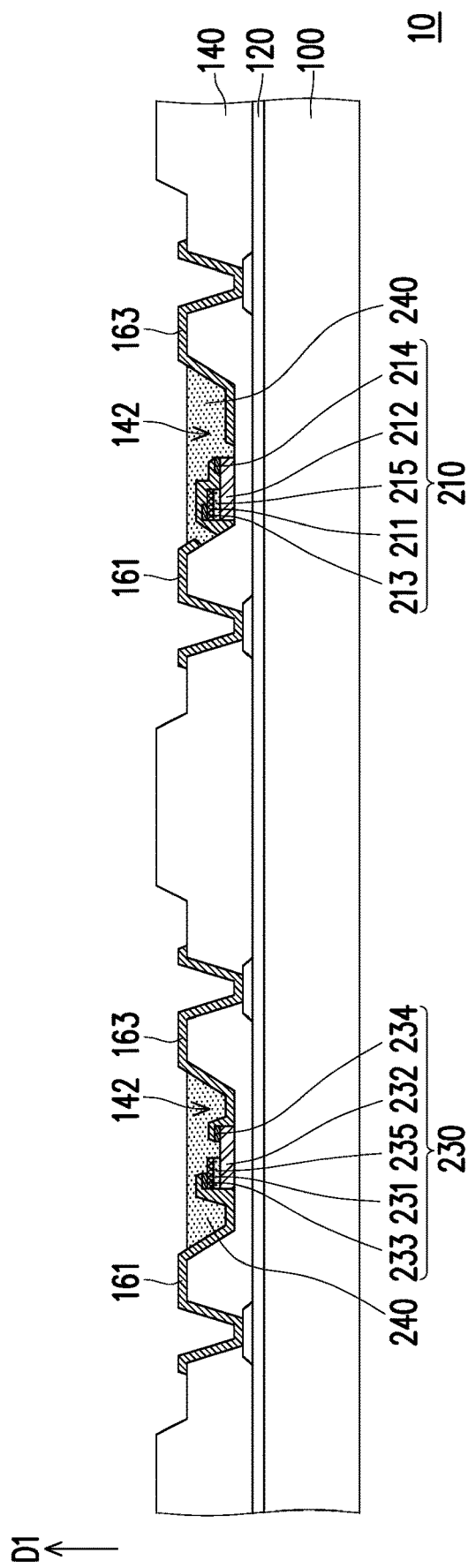

Next, referring to FIG. 2E and FIG. 2F, a second insulating layer 240 is formed on the first insulating layer 140. The method and the material of forming the second insulating layer 240 are similar to those of the first insulating layer 140 and shall not be repeatedly described herein. However, the main difference lies in that, after a second insulating material 240' is disposed, photolithography is performed on the second insulating material 240' to form the second insulating layer 240 in the accommodating space 142. For example, in the first direction D1 perpendicular to the substrate 100, the second insulating layer 240 overlaps with the accommodating space 142 and covers the first light emitting element 210, the third light emitting element 230, and a portion of the circuit layer M1 (labeled in FIG. 2C). With the above configuration, the second insulating layer 240 can fix the first light emitting element 210 and the third light emitting element 230 in the accommodating space 142 to reduce the possibility of fall-off or disconnection of the third light emitting element 230. In addition, the second insulating layer 240 can also separate the first signal line 161 from the first light emitting element 210 to reduce the possibility of electrical abnormality.

Figure 2G:
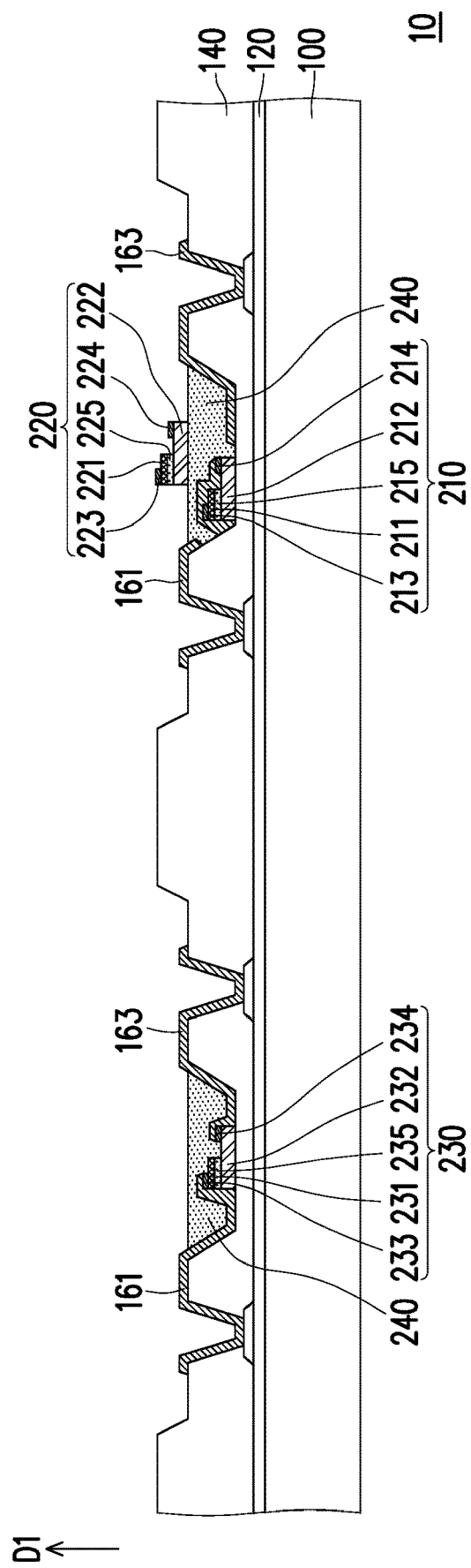

Next, referring to FIG. 2G, the second light emitting element 220 is disposed on the second insulating layer 240. Specifically, the second light emitting element 220 is disposed on the second insulating layer 240 located on the first insulating layer 140. The manufacturing method and the material of the second light emitting element 220 are similar to those of the first light emitting element 210 and the third light emitting element 230 and shall not be repeatedly described herein. In the present embodiment, the second light emitting element 220 includes a third semiconductor layer 221, a fourth semiconductor layer 222, a third electrode 223 electrically connected to the third semiconductor layer 221, and a fourth electrode 224 electrically connected to the fourth semiconductor layer 222. The third semiconductor layer 221 is formed on the fourth semiconductor layer 222. In some embodiments, the second light emitting element 220 further includes a second light emitting layer 225, and the second light emitting layer 225 is located between the third semiconductor layer 221 and the fourth semiconductor layer 222. The third electrode 223 and the fourth electrode 224 are formed on the same side of the second light emitting element 220 and face the same direction, e.g., the first direction D1. In the present embodiment, as shown in FIG. 2G, the fourth semiconductor layer 222 of the second light emitting element 220 contacts the second insulating layer 240, and the first electrode 213, the second electrode 214, the third electrode 223, and the fourth electrode 224 are all disposed facing the same first direction D1.

It is noted that, in the first direction D1 perpendicular to the substrate 100, the second light emitting element 220 overlaps with a portion of the first light emitting element 210, but the invention is not limited thereto. In some embodiments, it is also possible that the second light emitting element 220 does not overlap with the first light emitting element 210. From another perspective, the second light emitting element 220 is vertically stacked on the first light emitting element 210, so the second light emitting element 220 and the first light emitting element 210 and/or the third light emitting element 230 belong to film layers of different levels. With the above configuration, the second light emitting element 220 can overlap with the first light emitting element 210 and is not required to be disposed by the side of the orthogonal projection of the first light emitting element 210 on the substrate. Accordingly, the arrangement of other optical devices such as a light shielding layer or a light reflecting layer is not affected, and the impact on the light field pattern of light emission can be further reduced to improve the display quality of the pixel structure 10.

In addition, since the second insulating layer 240 has adhesiveness, the second light emitting element 220 can be fixed on the second insulating layer 240 to reduce the possibility of fall-off or movement of the second light emitting element 220 after arrangement and improve the reliability of the pixel structure 10.

Figure 2H:
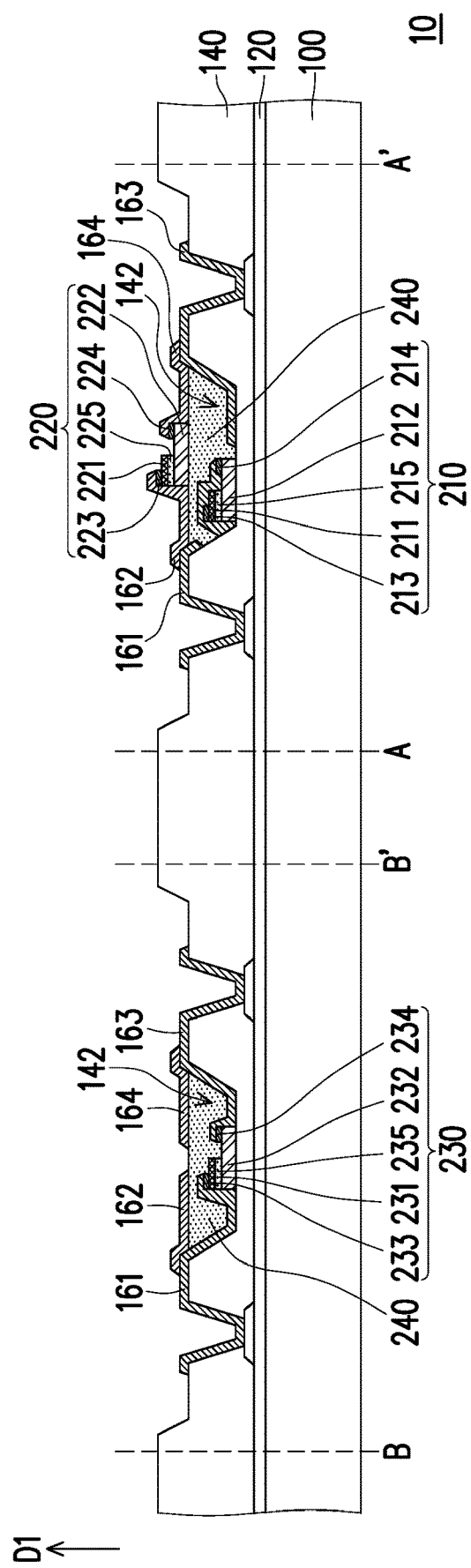

Referring to FIG. 2H, FIG. 3A, and FIG. 3B, FIG. 2H is a schematic cross-sectional view taken along cross-sectional lines A-A' and B-B' in FIG. 3A and FIG. 3B. FIG. 3A illustrates the first light emitting element 210 and the second light emitting element 220. For convenience of illustration and observation, the first light emitting element 210 covered by the second insulating layer 240 is shown in broken lines. FIG. 3B illustrates the third light emitting element 230. For convenience of illustration and observation, the third light emitting element 230 covered by the second insulating layer 240 is shown in broken lines. Next, a plurality of second signal lines 162 are formed on the second insulating layer 240. The repairing method of the pixel structure 10 further includes forming a plurality of fourth signal lines 164 on the second insulating layer 240 after the step of forming the second signal lines 162. The method of forming the second signal lines 162 and the fourth signal lines 164 is similar to that of the first signal lines 161 and the third signal lines 163 and shall not be repeatedly described herein. In other words, the second signal lines 162 and the fourth signal lines 164 may also be the same film layer and completed in the same process step, but the invention is not limited thereto. In some embodiments, the material of the second signal lines 162 and the fourth signal lines 164 may be a transparent conductive material. The transparent conductive material includes a metal oxide such as indium tin oxide, indium zinc oxide, aluminum tin oxide, aluminum zinc oxide, indium germanium zinc oxide, other suitable oxides (e.g., zinc oxide), or a stacked layer of at least two of the above, and the invention is not limited thereto.

In the present embodiment, the second signal lines 162 and the fourth signal lines 164 may be formed across the board on each of the light emitting elements, e.g., the first light emitting element 210 and the third light emitting element 230. In other words, the second signal lines 162 and the fourth signal lines 164 are disposed corresponding to all of the accommodating spaces 142, and in the first direction D1, the second signal line 162 and the fourth signal line 164 respectively overlap with a portion of the first light emitting element 210 and a portion of the third light emitting element 230. For example, a portion of the second signal line 162 and a portion of the fourth signal line 164 overlapping with the first light emitting element 210 may be respectively electrically connected to the third electrode 223 and the fourth electrode 224 of the second light emitting element 220. Another portion of the second signal line 162 and another portion of the fourth signal line 164 overlapping with the third light emitting element 230 only cover the second insulating layer 240 and are electrically connected to the first signal line 161 and the third signal line 163, but do not contact any of the light emitting elements, so no electrical abnormality occurs. Therefore, the repairing method can be simplified and the repairing time can be shortened.

It is noted that, as shown in FIG. 2H, FIG. 3A, and FIG. 3B, the second signal lines 162 may be electrically connected to the first signal lines 161 of the circuit layer M1 (labeled in FIG. 2C) and the third electrode 223 of the second light emitting element 220. The fourth signal lines 164 may be electrically connected to the third signal lines 163 and the fourth electrode 224 of the second light emitting element 220 to complete the electrical connection of the second light emitting element 220 to the active device layer 120. With the above configuration, since the first electrode 213, the second electrode 214, the third electrode 223, and the fourth electrode 224 are all disposed facing the same first direction D1, it is possible to simply form the second signal lines 162 and the fourth signal lines 164 directly on the surface on which the electrode is located to conduct the second light emitting element 220 to the active device layer 120 to thereby complete the repairing. Accordingly, the repairing method of the present embodiment can perform repairing without removing the light emitting element which causes dark spots due to precision tolerance or damage, and the repairing method of the pixel structure 10 is thus simplified. In addition, forming the second signal lines 162 and the fourth signal lines 164 across the board can further simplify the repairing method and shorten the repairing time to reduce the manufacturing cost of the pixel structure 10. The repaired pixel structure 10 can further have a desirable light field pattern, and the display quality using the above pixel structure 10 can be improved.

In brief, the pixel structure 10 and/or the repairing method thereof of the present embodiment can perform repairing without removing the first light emitting element 210 which causes dark spots due to precision tolerance or damage, and the repairing method of the pixel structure 10 is thus simplified. In addition, forming the second signal lines 162 and the fourth signal lines 164 across the board can further simplify the repairing method and shorten the repairing time to reduce the manufacturing cost of the pixel structure 10. Furthermore, after the pixel structure 10 is repaired, the second light emitting element 220 may overlap with a portion of the first light emitting element 210 and is disposed as a vertical stack. Therefore, the pixel structure 10 can have a desirable light field pattern to improve the display quality using the above pixel structure 10.

The reference numerals and part of the content of the foregoing embodiment apply to the following embodiment, wherein the same reference numerals are used to refer to the same or similar elements. Reference may be made to the foregoing embodiment for the omitted descriptions of the same technical content, which shall not be repeatedly described in the following embodiment.

Figure 4:
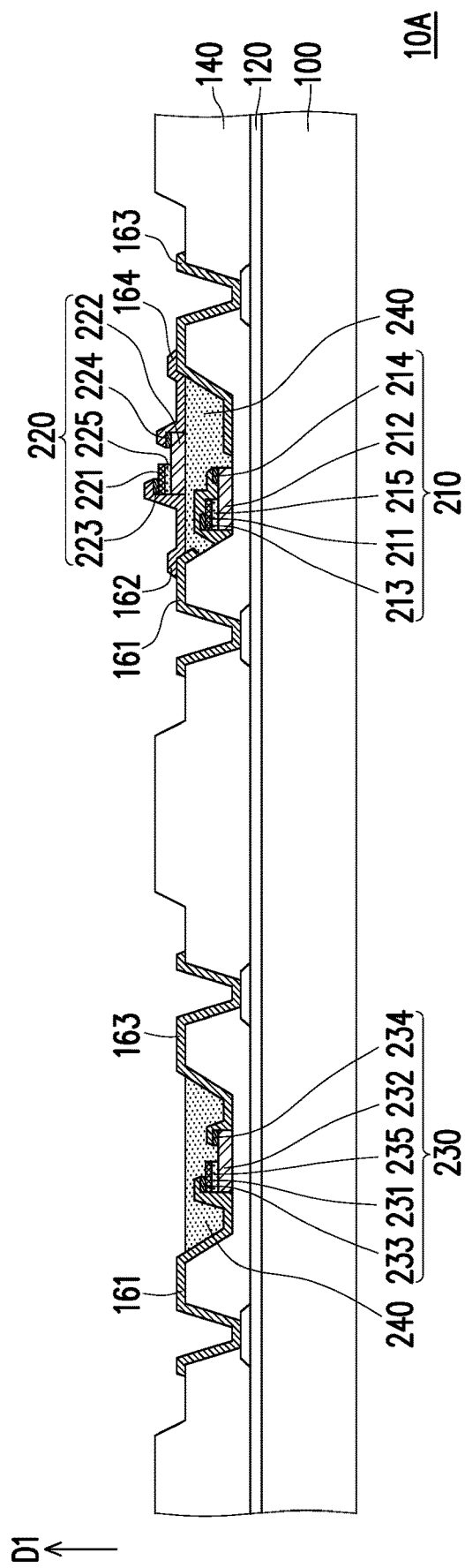
FIG. 4 is a schematic cross-sectional view of a pixel structure according to another embodiment of the invention.

FIG. 4 is a schematic cross-sectional view of a pixel structure according to another embodiment of the invention. Referring to FIG. 1 and FIG. 4, a pixel structure 10A of the present embodiment is similar to the pixel structure 10 of FIG. 1. The main difference lies in that the second signal line 162 is disposed on the first light emitting element 210, and in the first direction D1, the second signal line 162 overlaps with a portion of the first light emitting element 210. For example, the second signal lines 162 and fourth signal lines 164 are not formed across the board on each of the light emitting elements. In other words, according the result of the detection process, the user may selectively form the second signal lines 162 and the fourth signal lines 164 to correspond to the first light emitting element 120. Therefore, the second signal lines 162 and the fourth signal lines 164 only overlap with portions of the first light emitting element 210 and the second light emitting element 220. With the above configuration, a portion of the second signal line 162 and a portion of the fourth signal line 164 overlapping with the first light emitting element 210 may be respectively electrically connected to the third electrode 223 and the fourth electrode 224 of the second light emitting element 220. Accordingly, in addition to reducing the material consumption of the repairing method to reduce the manufacturing cost, technical effects similar to those of the foregoing embodiment can also be obtained.

In summary of the above, in the pixel structure and/or the repairing method thereof of an embodiment of the invention, when performing repairing, before the second light emitting element is transferred, the removal process may be performed to cut off the first signal line so that the first light emitting element is not connected to the active device layer. Therefore, it is possible to perform repairing without removing the first light emitting element which causes dark spots due to precision tolerance or damage. Accordingly, the electrical properties and functions of the active device layer are not affected, and the repairing method of the pixel structure can be simplified. In addition, forming the second signal lines and the fourth signal lines across the board can further simplify the repairing method and shorten the repairing time to reduce the manufacturing cost of the pixel structure. Furthermore, after the pixel structure is repaired, the second light emitting element may overlap with a portion of the first light emitting element and is disposed as a vertical stack. Therefore, the pixel structure can have a desirable light field pattern to improve the display quality using the above pixel structure. Also, the second signal lines and the fourth signal lines may be selectively formed to reduce the material consumption of the repairing method and further reduce the manufacturing cost.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A pixel structure comprising:
    a substrate;
    an active device layer disposed on the substrate;
    a first insulating layer disposed on the active device layer;
    a first light emitting element disposed on the first insulating layer, the first light emitting element comprising a first semiconductor layer, a second semiconductor layer, a first electrode electrically connected to the first semiconductor layer, and a second electrode electrically connected to the second semiconductor layer;
    a second light emitting element disposed on the first insulating layer, the second light emitting element comprising a third semiconductor layer, a fourth semiconductor layer, a third electrode electrically connected to the third semiconductor layer, and a fourth electrode electrically connected to the fourth semiconductor layer;
    a plurality of first signal lines disposed on the first insulating layer, the first signal lines being electrically connected to the active device layer, and the first signal lines being electrically insulated from the first electrode of the first light emitting element; and
    a plurality of second signal lines electrically connected to the first signal lines and the third electrode of the second light emitting element,
    wherein the second light emitting element overlaps with a portion of the first light emitting element in a first direction, and the first electrode, the second electrode, the third electrode, and the fourth electrode are disposed facing the first direction.

2. The pixel structure according to claim 1, further comprising a third light emitting element disposed on the first insulating layer, the third light emitting element comprising a fifth semiconductor layer, a sixth semiconductor layer, a fifth electrode electrically connected to the fifth semiconductor layer, and a sixth electrode electrically connected to the sixth semiconductor layer,
    wherein the first signal lines are electrically connected to the fifth electrode of the third light emitting element,
    wherein the fifth electrode and the sixth electrode are disposed facing the first direction.

3. The pixel structure according to claim 2, further comprising:
    a plurality of third signal lines disposed on the first insulating layer, the third signal lines being electrically connected to the active device layer, the third signal lines being electrically insulated from the second electrode of the first light emitting element, and the third signal lines being electrically connected to the sixth electrode of the third light emitting element; and
    a plurality of fourth signal lines, wherein a portion of the fourth signal lines is electrically connected to the third signal lines and the fourth electrode of the second light emitting element.

4. The pixel structure according to claim 2, wherein the first insulating layer has a plurality of accommodating spaces, and the first light emitting element and the third light emitting element are respectively disposed in the corresponding accommodating spaces.

5. The pixel structure according to claim 4, further comprising a second insulating layer disposed on the first insulating layer, wherein the second insulating layer covers the first light emitting element and the third light emitting element, and a distance between a center of the first light emitting element and a center line of the corresponding accommodating space is greater than a distance between a center of the third light emitting element and a center line of the other corresponding accommodating space.

6. A repairing method of a pixel structure, comprising:
    providing a substrate;
    forming an active device layer on the substrate;
    forming a first insulating layer on the active device layer;
    transferring a first light emitting element onto the first insulating layer;
    forming a circuit layer on the first insulating layer, the circuit layer being electrically connected to the active device layer;
    forming a second insulating layer on the first insulating layer, the second insulating layer covering the first light emitting element and the circuit layer;
    disposing a second light emitting element on the second insulating layer, the second light emitting element overlapping with a portion of the first light emitting element in a first direction; and
    forming a plurality of second signal lines on the second insulating layer, the second signal lines being electrically connected to the circuit layer and the second light emitting element,
    wherein the first light emitting element has a first electrode and a second electrode, the second light emitting element has a third electrode and a fourth electrode, and the first electrode, the second electrode, the third electrode, and the fourth electrode are disposed facing the first direction.

7. The repairing method of a pixel structure according to claim 6, wherein the circuit layer comprises a plurality of first signal lines and a plurality of third signal lines, the circuit layer electrically connects the active device layer to the first electrode of the first light emitting element, and after the step of forming the circuit layer, the repairing method further comprises:
    performing a removal process to cut off connection between the circuit layer and the first light emitting element and electrically insulate the first signal lines from the first light emitting element.

8. The repairing method of a pixel structure according to claim 7, further comprising:
    after the step of forming the first insulating layer and before the step of forming the first signal lines, transferring a third light emitting element onto the first insulating layer, wherein the third light emitting element has a fifth electrode and a sixth electrode, and the first signal lines are electrically connected to the fifth electrode of the third light emitting element; and
    after the step of forming the second signal lines, forming a plurality of fourth signal lines on the second insulating layer, wherein a portion of the fourth signal lines is electrically connected to the third signal lines and the fourth electrode of the second light emitting element, wherein the third signal lines are electrically insulated from the second electrode of the first light emitting element, and the third signal lines are electrically connected to the sixth electrode of the third light emitting element.

9. The repairing method of a pixel structure according to claim 8, wherein a method of forming the second signal lines comprises disposing the second signal lines on the first light emitting element and the third light emitting element, wherein the second signal lines respectively overlap with a portion of the first light emitting element and a portion of the third light emitting element in the first direction.

10. The repairing method of a pixel structure according to claim 8, wherein a method of forming the second signal lines comprises disposing the second signal lines on the first light emitting element, and the second signal lines overlap with a portion of the first light emitting element in the first direction.

* * * * *